United States Patent [19]

Brown et al.

[11] Patent Number: 5,576,903
[45] Date of Patent: *Nov. 19, 1996

[54] METHOD AND APPARATUS FOR ADMINISTERING DATA ON MAGNETIC TAPE MEDIUM BY WAY OF A HEADER SEGMENT

[75] Inventors: Thomas M. Brown; William C. Dodt, both of Broomfield; Donald F. McCarthy, Westminster; Richard Mendoza, Boulder; Charles A. Milligan, Golden, all of Colo.

[73] Assignee: Storage Technology Corporation, Louisville, Colo.

[*] Notice: The term of this patent shall not extend beyond the expiration date of Pat. No. 5,325,370.

[21] Appl. No.: 266,026

[22] Filed: Jun. 27, 1994

Related U.S. Application Data

[63] Continuation-in-part of Ser. No. 791,793, Nov. 12, 1991, Pat. No. 5,369,641.

[51] Int. Cl.⁶ .................................................. G11B 5/09
[52] U.S. Cl. .................................. 360/48; 360/49
[58] Field of Search .......................... 360/14.2, 19.1, 360/27, 33.1, 46, 48, 53, 60, 70, 72.2, 49; 371/2.2, 37.4; 395/840

[56] References Cited

U.S. PATENT DOCUMENTS

| | | | |
|---|---|---|---|
| 3,932,894 | 1/1976 | Arter et al. | 360/70 X |
| 4,321,632 | 3/1982 | Leis et al. | 360/49 |
| 4,393,445 | 7/1983 | Milligan et al. | 360/72.2 |
| 5,065,261 | 11/1991 | Hughes et al. | 360/70 |
| 5,325,370 | 6/1994 | Cleveland et al. | 360/53 X |
| 5,367,410 | 11/1994 | McCarthy | 360/48 |
| 5,369,532 | 11/1994 | Dodt et al. | 360/48 |
| 5,369,641 | 11/1994 | Dodt et al. | 371/2.2 |

*Primary Examiner*—Aristotelis Psitos
*Assistant Examiner*—Patrick Wamsley
*Attorney, Agent, or Firm*—Duft, Graziano & Forest, P.C.

[57] ABSTRACT

The control software and hardware in the tape drive control unit creates and manages a header segment at the beginning of the magnetic tape. This header is interposed between a leader portion of the magnetic tape on the 3480-type cartridge and the remainder of the magnetic tape contained therein. This header segment contains two sections, a first of which is a data record directory that is used by the control unit to denote the location of each data record written on to the magnetic tape as well as administrative information associated with the data record. The second section of the header is an administrative information section that contains data relating to the magnetic tape itself. The administrative information includes the identification of the tape volume, the tape drive, write protect status of the magnetic tape, identification of the media, error record log and other information that enables the user, the host processor and the tape drive control unit to manage the data records written onto the magnetic tape without reference to any other sources of administrative data. In addition, the header itself can be self protected by computing an error correction code across the data contained within the header to enable the control unit to identify whether the header integrity has been compromised.

28 Claims, 9 Drawing Sheets

FIG. 6

| PHYSICAL SCAN GROUP COUNT | FILE ID NUMBER | LOGICAL BLOCK NO. OF HOST DATA PACKET | RESERVED |
|---|---|---|---|
| 4 BYTES | 3 BYTES | 5 BYTES | 20 BYTES |
| 601 | 602 | 603 | 604 |

FIG. 10

| VOLUME ID | TAPE TYPE AND LENGTH | MFG ID | USAGE STATISTICS | RECORDING TYPE | LAST SCAN GROUP | ERROR STATISTICS |
|---|---|---|---|---|---|---|
| 80 BYTES | 1 BYTE | 128 BYTES | Y BYTES | 1 BYTE | 4 BYTES | X BYTES |
| 1001 | 1002 | 1003 | 1004 | 1005 | 1006 | 1007 |

METHOD AND APPARATUS FOR ADMINISTERING DATA ON MAGNETIC TAPE MEDIUM BY WAY OF A HEADER SEGMENT

CROSS REFERENCE TO RELATED APPLICATIONS

This application is a continuation-in-part of U.S. patent application Ser. No. 07/791,793, now U.S. Pat. No. 5,360,641 titled "Method and Apparatus for Detecting and Correcting Errors in Data on Magnetic Tape Media" filed Nov. 12, 1991.

FIELD OF THE INVENTION

This invention relates to magnetic data storage media and, in particular, to a method and apparatus for administering the data that are written on a magnetic tape media.

PROBLEM

It is a problem in the field of data storage systems to maximize the data storage capacity of the data storage medium while minimizing both the cost of the medium and the data retrieval time. Magnetic tape has become the industry standard data storage medium for the storage and retrieval of large amounts of data, where the media cost must be kept to a minimum and the data retrieval time is not a critical factor. The data storage capacity has been increased and media cost of magnetic tape have been reduced by the use of helical scan data recording techniques on magnetic tape media.

Helical scan tape drive systems make use of the 3480-type magnetic tape cartridge which contains a single reel of half inch magnetic tape. The 3480-type magnetic tape cartridge is an industry standard media form factor used in the data processing industry for longitudinal recording of data on magnetic tape. The selection of this form factor is desirable due to the fact that automated library systems, such as the 4400 Automated Cartridge System (ACS) manufactured by Storage Technology Corporation of Louisville, Colorado, are presently used to robotically store and retrieve a large number of 3480-type magnetic tape cartridges for an associated plurality of tape drives. The helical scan data recording format enables the user to store significantly more data on a 3480-type form factor magnetic tape cartridge than is presently available with longitudinal recording on magnetic tape.

A significant problem with all magnetic tape media is that a significant segment of the data retrieval time represents the mechanical positioning of the magnetic tape on the associated tape drive to locate a specific data record or end of data to enable the associated host computer to begin reading a data record or writing new data records on the magnetic tape. Furthermore, these tape drive systems rely on the host computer to administer the data that are stored on the magnetic tape. The administration includes retaining error logs, user related administrative information, identification of the write protect status of the data, physical location of the data on the magnetic tape, etc. Much other relevant media administrative data (such as identification of the manufacturer of the magnetic tape, a record of the read/write history of the magnetic tape, etc.) is presently unavailable in data processing systems. The administrative data presently used are host computer dependent, being stored in the memory of the host computer. There presently exists no capability to administer the data on the magnetic tape itself when moved from one host computer system to another. The integrity of the administrative information that relates to the data record stored on the magnetic tape is therefore dependent on the magnetic tape being read and written only by a single host computer. This is an impractical limitation in many environments and there presently does not exist any mechanism for reliably administering the data records that are written on to a mountable magnetic tape medium.

SOLUTION

The above described problems are solved and a technical advance achieved in the field by the method and apparatus of the present invention for administering data on a magnetic tape medium to make the magnetic tape self-defining. This is accomplished by the use of control software and hardware in the tape drive control unit that creates and manages a header segment at the beginning of the magnetic tape. This header is interposed between a leader portion of the magnetic tape on the 3480-type cartridge and the remainder of the magnetic tape contained therein. This header segment contains two sections, a first of which is a data record directory that is used by the control unit to denote the location of data records written on to the magnetic tape as well as administrative information associated with the data record. The second section of the header is an administrative information section that contains data relating to the magnetic tape itself. The administrative information includes the identification of the tape drive, write protect status of the magnetic tape, identification of the medium, error record log and other information that enables the user, the host processor and the tape drive control unit to manage the data record written onto the magnetic tape without reference to any other sources of administrative data. In addition, the header itself can be self protected by computing a error correction code across the data contained within the header to enable the control unit to identify whether the header integrity has been compromised.

To simplify the task of locating a data record, search segments, consisting of a predetermined number of scan groups, are used. Whenever the magnetic tape cartridge is mounted on a tape drive and the magnetic tape contained therein threaded through the tape threading path onto the tape drive takeup reel, the tape drive control unit accesses the header segment of the magnetic tape to read the administrative data written thereon. If the host processor has requested a locate data record operation, the identity of the requested data record is used to scan the data record directory section of the header segment to locate the directory entry relating to the search segment of the requested data record. Once this directory entry for the requested data record has been located, the control unit can use the information, contained within this directory entry, indicative of the physical position of the requested data record on the magnetic tape. This physical positioning information consisting of a physical scan group count, can then be used by the tape drive to quickly and precisely position the beginning of this data record under the read/write heads of the tape drive. The use of this positioning information reduces the tape positioning time, thereby improving the data retrieval time of the tape drive system. The positioning information is indicative of the physical location of the data record on the magnetic tape and the magnetic tape typically includes positioning information written into at least one of the longitudinal tracks contained on the helical scan magnetic tape. This same positioning information is available to locate the end of any data record written on the magnetic tape to enable the tape drive to write the next successive data record following the physical end of the last previously written data record.

Data records can also be written in varying formats on the magnetic tape since the administrative information contained in the header segment enables the associated control unit to physically locate the data record and identify its format and extent independent of the associated host processor. In prior magnetic tape systems, a fixed block architecture is typically used in order to enable the host processor to manage the magnetic tape, since the magnetic tape was divided into a plurality of fixed size segments. This uniformity enabled the host processor to read and write data records on any magnetic tape since the format of the magnetic tape was consistent. With the availability of administrative information contained in a header segment, both fixed block and variable length data records can be written on to the magnetic tape independent of the host processor since the magnetic tape is self defining.

The second section of the header segment includes administrative information relating to the read/write history of the data records, error logs to note the physical integrity of the magnetic tape, identification of the manufacturer of the magnetic tape, write protect status of the magnetic tape, magnetic tape volume serial number, any magnetic tape. This administrative data enable the control unit and the host additional information relating to the administration of the data records stored on the processor to identify a magnetic tape that is subject to an unacceptable level of errors on the medium. Such a magnetic tape can then be retired and the data contained thereon rewritten to a new tape before the integrity of this data is compromised. In addition, the error logs contain data that can be used to detect tape drive failures since a record of the errors and corresponding tape drives is maintained in the header.

Therefore, the method and apparatus of the present invention enable the magnetic tape to be self defining by the use of a header segment located at the beginning of the magnetic tape. The self defining capability enables the magnetic tape to be used by any host processor and provides additional features and capabilities heretofore unavailable on magnetic tape media.

BRIEF DESCRIPTION OF THE DRAWING

FIG. 6 illustrates the elements contained in the directory section of the header segment of the magnetic tape;

FIG. 10 illustrates the elements contained in the administrative section of the header segment of the magnetic tape;

DETAILED DESCRIPTION

Tape Drive System Architecture

Figure 3:
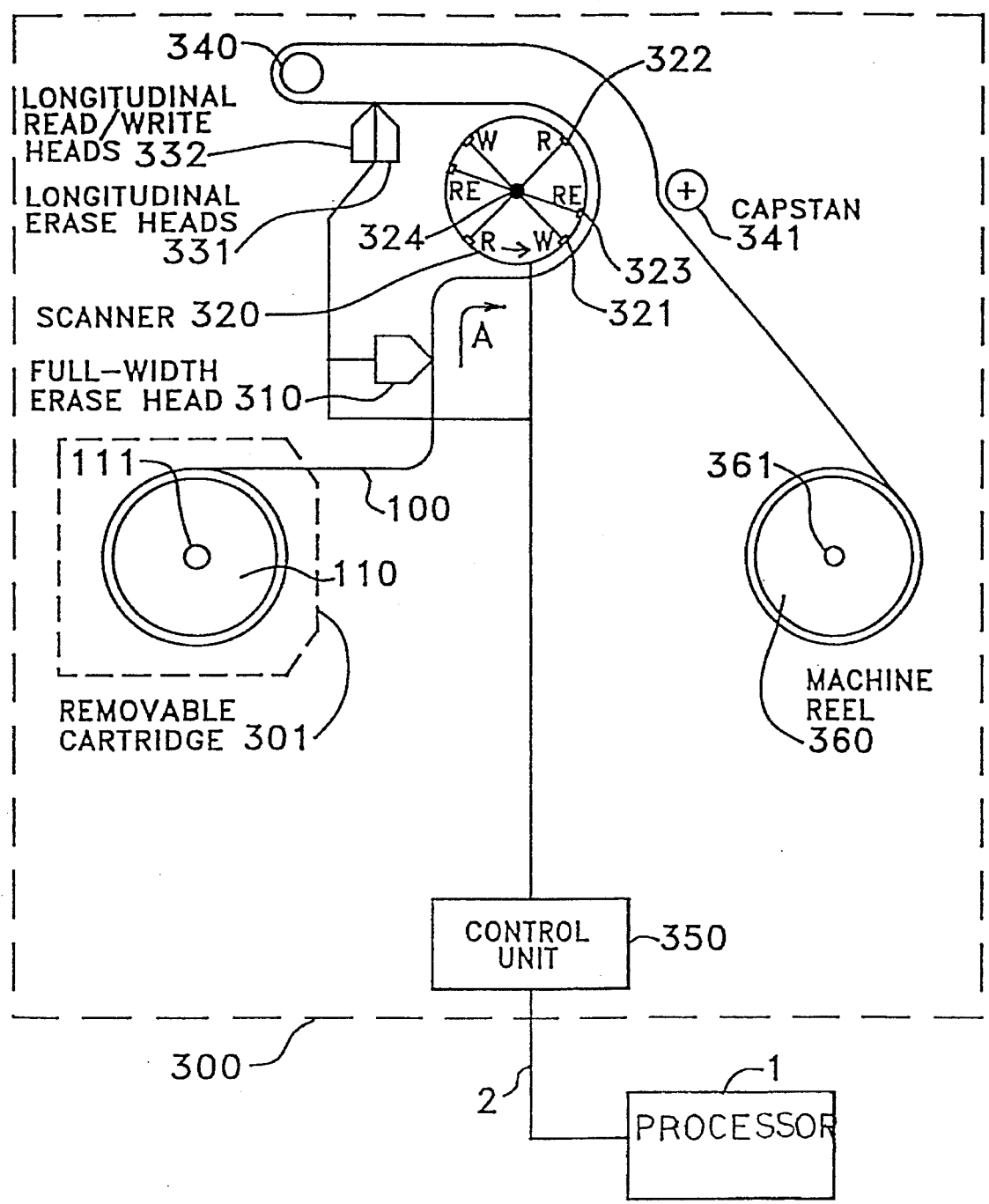
FIG. 3 illustrates in block diagram form the overall architecture of a typical tape drive control unit.

The apparatus illustrated in FIG. 3 represents the well known tape transport elements found in helical scan tape drive subsystems 300 that are used to read and write data on magnetic tape 100. The magnetic tape 100 is wound on a single reel 110 which rotates around spindle 111 within magnetic tape cartridge 301. In a helical scan tape drive subsystem 300, magnetic tape 100 from magnetic tape cartridge 301 is threaded in direction A past a fixed full width erase head 310, scanner 320 (which contains two pairs of helical read heads 322 and two pairs of helical write heads 321 and one pair of erase heads 323), a fixed longitudinal erase head 331 and a fixed longitudinal read/write head 332. The magnetic tape 100 then passes around guide 340, over capstan 341 to be wound on machine reel 360 which rotates around spindle 361. The full width erase head 310 erases the entire width of magnetic tape 100 and is used when data is recorded on virgin tape. It is also used when data are recorded on a previously used magnetic tape, if none of the data previously recorded on magnetic tape 100 is to be preserved.

Host processor 1 transmits a stream of data records to control unit 350 in tape drive subsystem 300, where the data records are formatted for writing in helical scan form on magnetic tape 100 via scanner 320. The tape wrap angle around scanner 320 is slightly greater than 180 so that a pair of read heads 322, a pair of write heads 321 and one erase head 323 are constantly in contact with magnetic tape 100 in order to continuously read and write data thereon. The helical write head pairs 321 simultaneously record two tracks of data at a time on magnetic tape 100 with an azimuth angle between adjacent tracks being approximately plus and minus 20. Similarly, helical read head pairs 322 simultaneously play back two tracks of data at a time from magnetic tape 100. There are also three fixed longitudinal erase 331 and read/write heads 332 to read and write data on the corresponding three longitudinal tracks contained on magnetic tape 100: control, time code and one to be determined. These three longitudinal read/write heads 332 can be used individually or in any combination when editing new information into pre-recorded data.

Physical Format of Helical Scan Magnetic Tape

Figure 1:
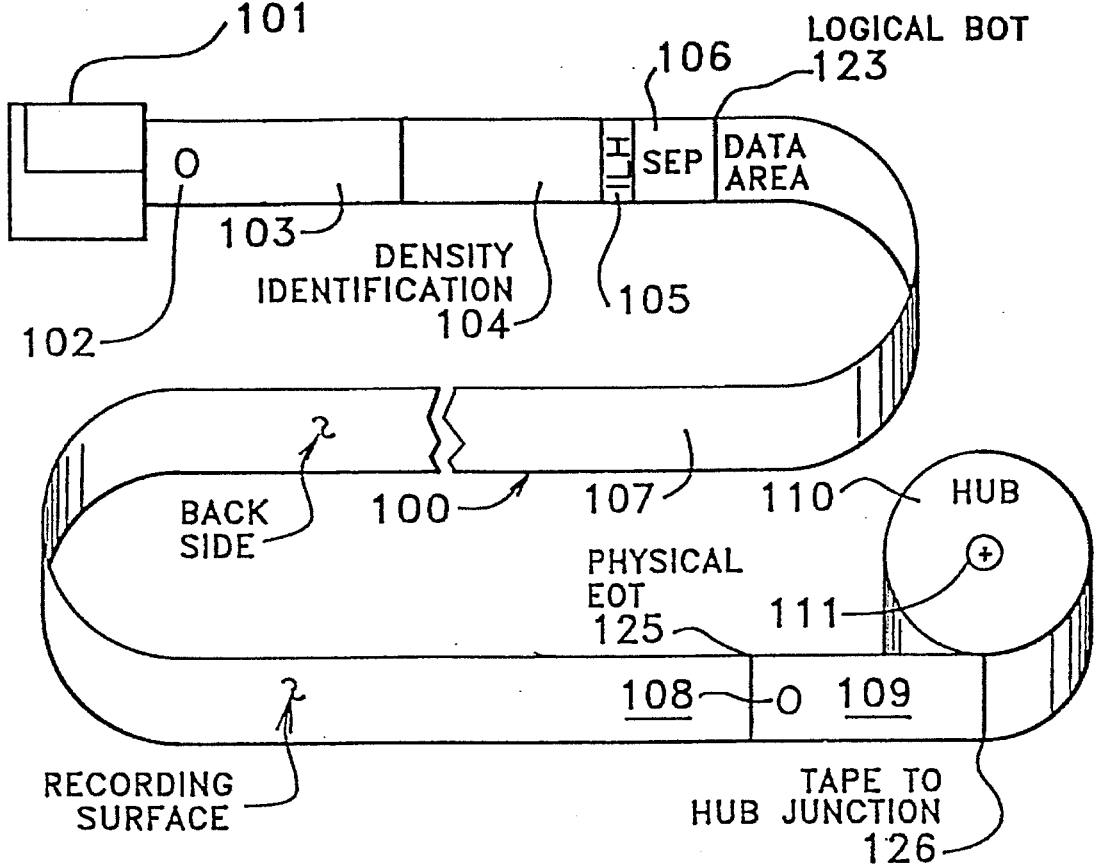
FIG. 1 illustrates the physical format of the magnetic tape medium.

FIG. 1 illustrates the physical format of the helical scan magnetic tape 100, including the header (ILH) segment 105 thereof (also termed internal leader header). The magnetic tape 100 includes a leader block 101 that is attached at one end thereto and a single reel 110 around which magnetic tape 100 is wound into cartridge 301. A length of leader 103 is interposed between the leader block 101 and the density identification segment 104 of magnetic tape 100. The leader section 103 includes a beginning of tape hole 102 which provides an indication to the tape drive subsystem 300 that the one end of the magnetic tape 100 is reached. The density identification segment 104 typically consists of 256 scan groups 700 (FIG. 7) written on magnetic tape 100. The density identification segment 104 represents data, for tape drive control unit 350 to access, indicative of the format of the data recorded on magnetic tape 100. Internal leader header segment 105 is located at the end of density identification segment 104 of magnetic tape 100. The internal leader header 105 consists of a three scan groups 700, the third of Which is an ECC scan group to error check the two preceding internal leader header scan groups. The internal leader header 105 is followed by separator segment 106 of magnetic tape 100, which typically consists of 125 scan groups. The separator segment 106 isolates the logical beginning of tape (BOT) 123, which is the start of the data area 107 of magnetic tape 100, from the prepended header information described above. The data area 107 of magnetic tape 100 constitutes the majority of magnetic tape 100 and ends at physical end of tape 125 which is a predetermined distance from tape to hub junction 126, wherein magnetic tape 100 is affixed to single reel 110 of magnetic tape cartridge 301. A length of trailer tape 109 may be interposed between the physical end of tape 125 and tape to hub junction 126. This serves as a method of wrapping magnetic tape 100 around the reel 110 in order to provide a method of attachment thereto and also includes an end of tape hole 124 which indicates to tape drive subsystem 300 that an end of the magnetic tape 100 has been reached.

Internal Leader Header

Figure 5:
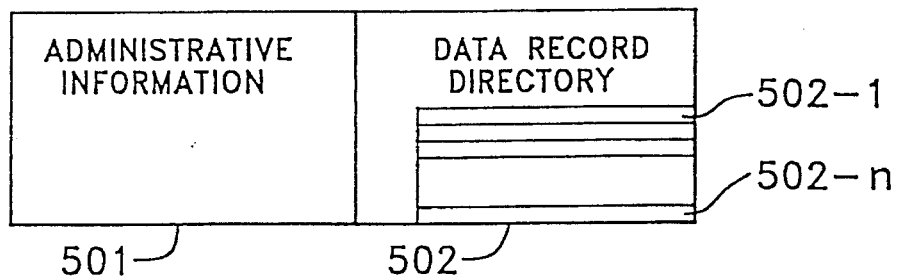
FIG. 5 illustrates the elements contained in the header segment of the magnetic tape.

The internal leader header 105 consists of administrative information which typically includes:

Data Record Directory
  Logical block locations
Administrative Information
  Location of last Data Scan group written
  Number of volume loads
  Number of read/write errors for the last n mounts
  Serial number of last m drives upon which this cartridge was mounted
    Volume ID
    Time and date stamp of mount
    Tape type and length
    Safe File information
    Manufacturer's ID and Production Batch Numbers The internal leader header segment 105 of magnetic tape 100 is read on every load of magnetic tape cartridge 301 into a tape drive subsystem 300. The internal leader header segment 105 is updated by magnetic tape drive subsystem 300 prior to magnetic tape 100 being physically unloaded therefrom in order to update the header information concerning read and write information contained therein. The internal leader header 105 illustrated in FIG. 5 includes two segments: administrative information 501, and data record search directory 502. The data record search directory 502 includes a plurality of entries (502-1 to 502-n), one for each search segment boundary that are crossed.

In addition, the data that are recorded on magnetic tape 100 are divided into super groups, each of which comprise up to 24 scan groups of data with an appended ECC scan group. These super groups of data are written on to the magnetic tape 100 via the search segments, with super groups of data, due to their variable size, and not necessarily beginning at a search segment boundary. The search segments are 32 scan groups in length. Thus, the location of a particular data record can be determined from the physical scan group count of the start of the super group.

Figure 4:
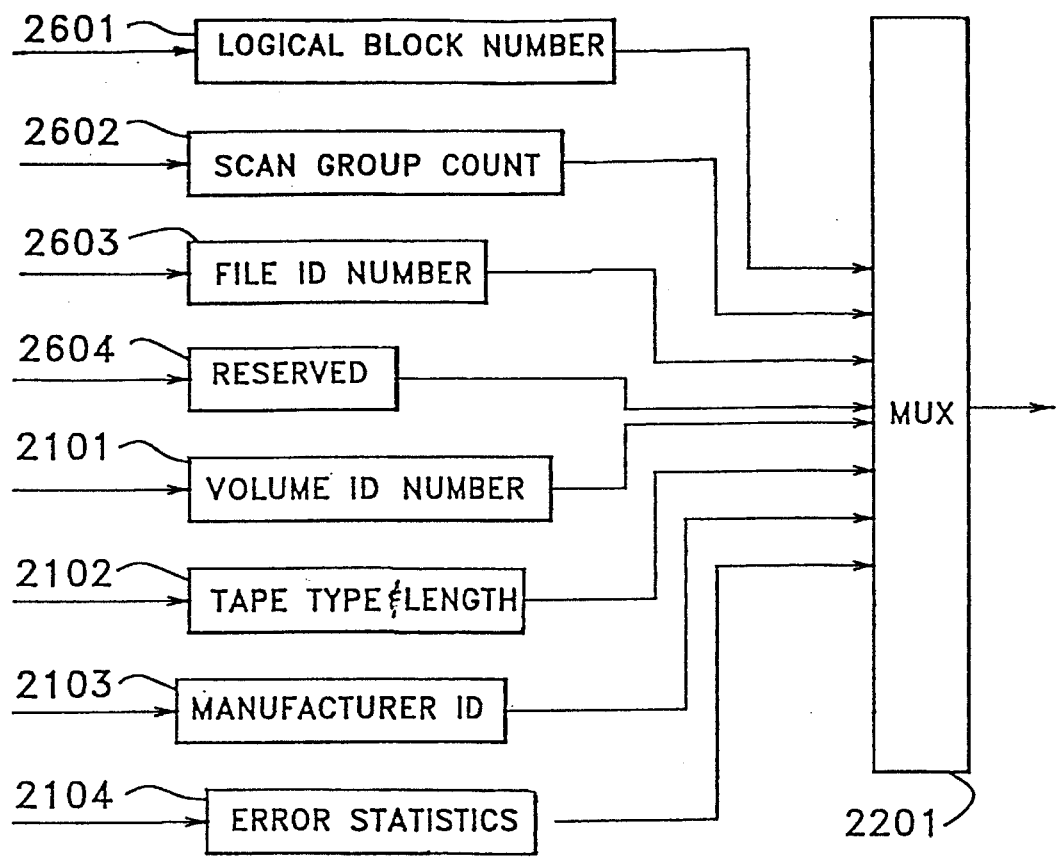
FIG. 4 illustrates in block diagram form the elements used to create and update the header segment of the magnetic tape.

Data Record Directory Each directory entry 502-* includes the information illustrated in FIG. 6 and written by the apparatus illustrated in FIG. 4. In fact, the apparatus of FIG. 4 can be software elements located in tape drive control unit 350 used to create a scan group 700 and control unit 350 can count the total number of scan groups, for internal leader header 105. The first element in the entry is a physical scan group count 601 of four bytes length stored in element 2602 which represents a unique physical location on magnetic tape 100. Since each search segment contains a fixed number of scan groups 700 written on to magnetic tape 100, the location of a specific scan group within the selected search segment is a simple process of positioning the magnetic tape 100 a calculated distance from the beginning of tape point. The second element contained in the entry is a file identification number 602 of three bytes created by element 2603 and which identifies a numerical file in which scan group 700 is contained. The file identification 602 is used internally in tape drive subsystem 300. The file identification 602 is also termed file marks or tape marks and are sent from host processor 1, and they are used to separate data. This file ID number 602 provides a scan group to file correspondence in order to simplify the administering of the data within files on magnetic tape 100. The third element contained in the entry is a logical block number of first starting host processor data packet within a super group 603, which is a five byte long field created by element 2601. This block number identifies the first data group of a super group that follows the search segment boundary. The final element in the entry is a reserved field 604 of twenty bytes for future use as to be determined for future elements 2604 such as a data record specific write protect bit.

Administrative Information

FIG. 10 illustrates the information typically contained in the administration information section 501 of internal leader header 105. A first segment of information contained in internal leader header 105 is the volume identification 1001 which consists of 80 bytes created by element 2101 that represent the volume identification number assigned to magnetic tape cartridge 301. A second section of administrative information 501 is the tape type and length, which is a one byte long field created by element 2102 to indicate the type of medium and its length. A third segment 1003 of administrative information created by element 2103 is the tape manufacturer's identification and production batch number, which consists of 128 bytes of information, to provide the user with information concerning the date of manufacture of this medium as well as the identification of the manufacturer and their particular production batch number. This information assists the user in identifying media that has been recalled by the manufacturer or media of a certain class that is more prone to errors than other similar types of media.

Further entries that can be included in administration information 501 are tape usage statistics 1004 created by element 2104 indicative of the number of times that magnetic tape cartridge 301 has been loaded on tape drive subsystem 300 and the number of read and write cycles magnetic tape 100has been subject to. These usage statistics can include the serial number of tape drive subsystem 300, as well as date and time stamps to record load including the initial use date. Another entry 1005 is a recording type byte created by element 2105 to indicate write-without-Retry or a write protect file safe status bit for magnetic tape 100. Further information includes error data 1007 created by element 2107, including a record of the number of read/write errors detected and corrected in the last n times the magnetic tape is mounted on a tape drive as well as the identification of the tape drives upon which this magnetic tape was mounted. The error data 1007 include a collection of all the error statistics that are produced during the last n mounts in order to enable host processor 1 to access this information in order to determine whether magnetic tape 100 is flawed or whether the associated tape drive subsystem 300 on which is was mounted is experiencing regular failures. Finally, additional memory is provided for future use to enable magnetic tape 100 to store predefined information, either selected by the user or defined by the tape drive manufacturer.

Data Format of the Helical Scan Magnetic Tape

Figure 2:
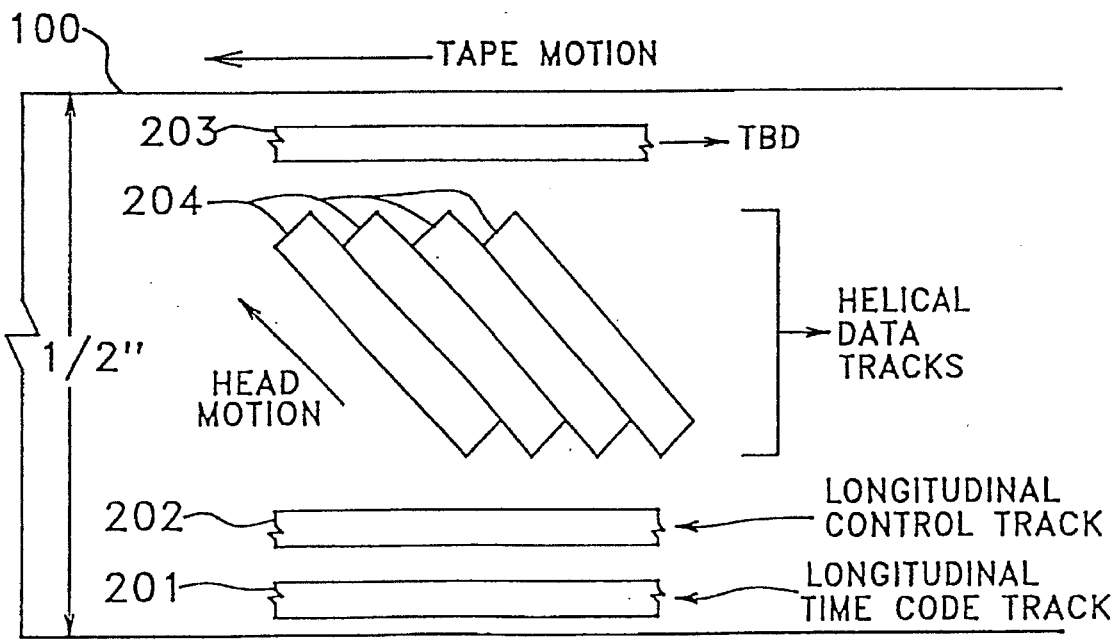
FIG. 2 illustrates the data recording format of helical scan magnetic tape.
Figure 7:
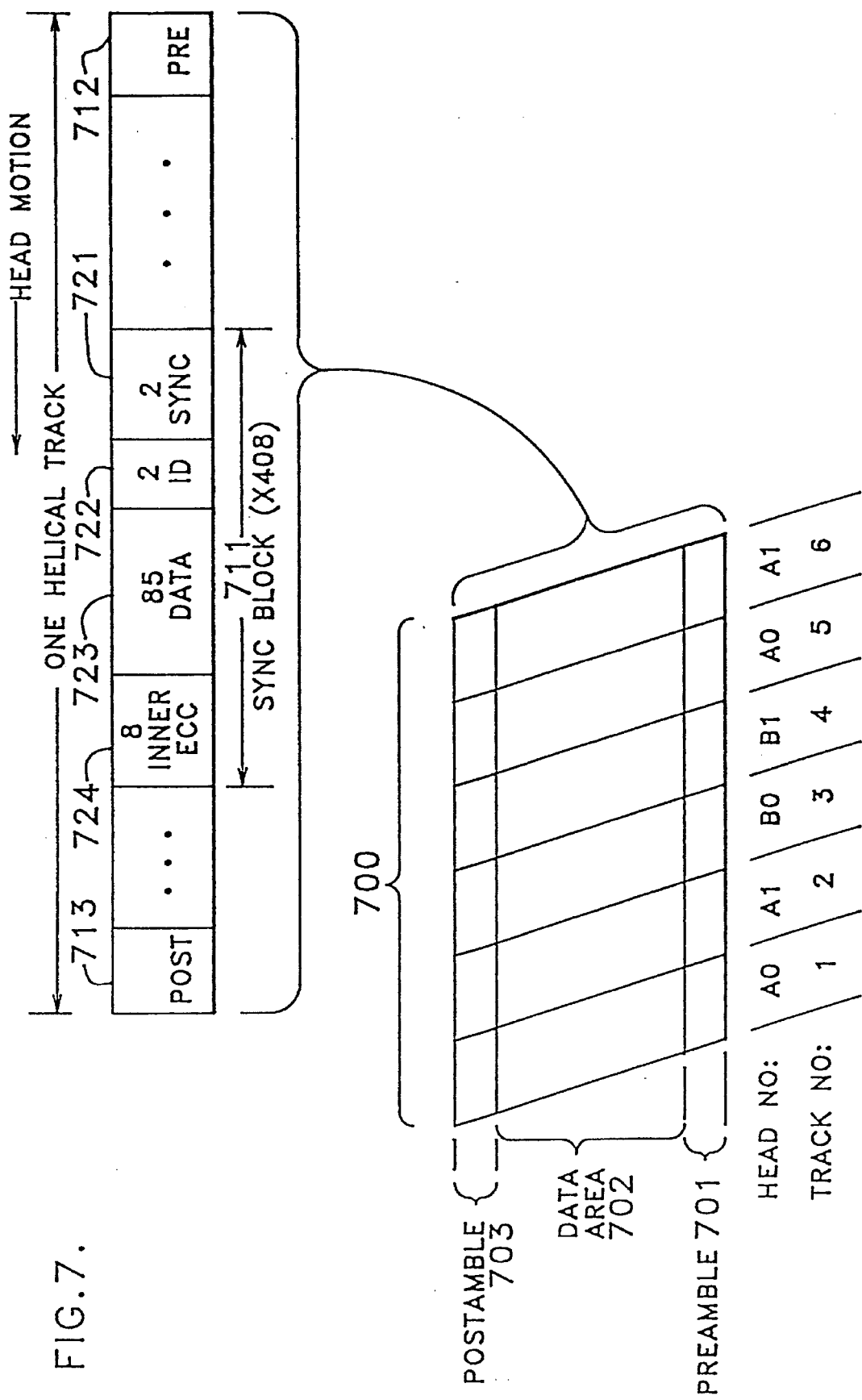
FIG. 7 illustrates additional detail of the data recording format of the helical scan magnetic tape.

FIGS. 2 and 7 illustrate the data recording format of helical scan magnetic tape 100 used herein. The scan group 700 is the basic unit for formatting data on magnetic tape 100. As two adjacent write heads 321 of scanner 320 move across magnetic tape 100, two helical tracks 204 of data are simultaneously written on to magnetic tape 100. Once scanner 320 has completed one half of a revolution, the other pair of write heads 321 begins to write the next two adjacent tracks 204 on to magnetic tape 100. One and a half revolutions of scanner 320 produce the six tracks (1–6) illustrated in FIG. 7 to complete a single scan group 700. As can be seen from FIG. 7, a postamble 703 and preamble 701 are written on either end of the data area 702 of each track 204 written on to magnetic tape 100 in order to enable read heads 322 to accurately read the data contained therein.

In addition, the data format of a single helical track is illustrated in FIG. 7 to note that preamble data begin a track on magnetic tape 100 and postamble data end a track on magnetic tape 100. Interposed between preamble 712 and postamble 713 are 408 sync blocks 711, each of which contain eighty-five bytes of user data 723. In addition, two synchronization bytes 721 are prepended to data 723 along with two identification bytes 722. Eight bytes of inner error correcting code 724 are appended to the end of data 723 in order to complete the format of sync block 711. The inner ECC code 724 illustrated in FIG. 7 covers both data 723 and identification 722 but not synchronization bytes 721 contained in sync block 711. Therefore, a 95, 87 Reed Solomon code is formed to detect errors contained in data 723 and identification 722 fields of sync block 711. The sync pattern 721 portion of sync block 711 is a fixed pattern of data bits used to resynchronize the read clock and logic after dropouts. Of the 408 sync blocks 711 in a single track 204, twenty-four are used at the start of track 204 for outer ECC check bytes (described below). Therefore, there are (408–24)×85=32,640 bytes per track 24 of user data 723. With six tracks 204 per scan group 700, a scan group 700 therefore contains 195,840 bytes of user data 723.

Figure 9:
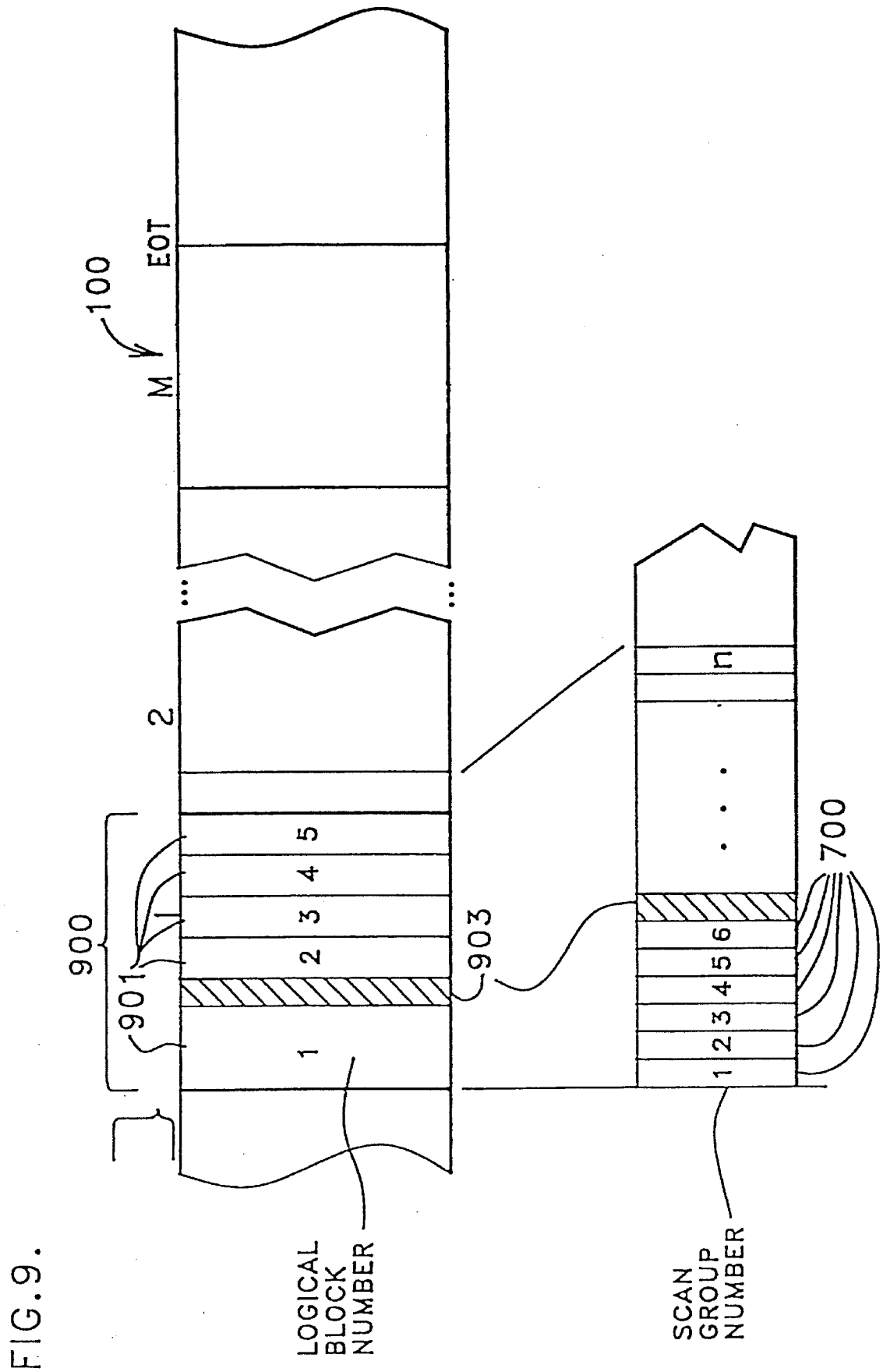
FIG. 9 illustrates the positioning information recorded on the magnetic tape.

FIG. 9 illustrates the positioning information recorded on the magnetic tape 100. The basic unit used to transfer data from the host processor 1 to magnetic tape 100 is the data block 901, which is analogous to a conventional data record. Each data block 901 sent by the host processor 1 to be written to magnetic tape 100 is sequentially assigned a unique block number by the tape drive control unit 350. Data blocks 901 are logical entities which may have different lengths, unlike fixed length blocks which are required by some prior art magnetic recording systems. A data block 901 may be larger than a physical scan group 700, and may also span two or more adjacent scan groups 700. Since each physical scan group 700 is the same size, the variable size of the data blocks 901 is transparent to the tape drive control unit 350 when a high speed data block search is conducted using the longitudinal track servo information in conjunction with the scan group location in the internal leader header 105.

Data block IDs are noted for each search segment in the internal leader header 105 in order to provide a mechanism for increasing the speed of a search, and for verifying the location of the contiguously stored data block 901. These data block IDs are referred to as "host block IDs" since the data block 901 is the basic unit used by the host processor 1 to write data to magnetic tape 100. Scan group 904 boundaries are locatable via the servo control track 202 at a 60× or 100× search speed. Furthermore, the placement of block IDs in scan group headers provides a verification of the correctness of a search to a particular search segment 904 wherein a block having a predetermined (expected) ID is expected to be found. The scan group header included in the scan group 700 typically includes the following information:

| | | |
|---|---|---|
| 1. Type of scan group | | 1 byte |
| 2. Logical scan group number | | 4 bytes |
| 3. Beginning host block ID (Block ID of byte 0) | | 5 bytes |
| 4. Ending host block ID (Block ID of last byte) | | 5 bytes |
| 5. File ID number | | 3 bytes |
| 6. Number of pad bytes in logical scan group | | 3 bytes |
| 7. Information data byte: >--> File safe bit Write-without-retry bit | | 1 byte |
| 8. Continuation Information: >--> First host block continued from previous scan group bit Ending host block continues into next scan group bit | | 1 byte |
| 9. Scan group CRC | | 2 bytes |
| 10. Scan group header CRC (fixed) | | 2 bytes |
| 11. Pointer to first packet that begins in this scan group | | 3 bytes |
| 12. Variable Information: Physical Scan Group Count rewrite Count Variable CRC | | 4 bytes 1 byte 2 bytes |
| 13. If an ECC group, the number of data groups covered by this ECC. If a data group, the sequence number within this ECC super-group. | | 1 byte |
| 14. Miscellaneous information | | 18 bytes |
| SUB TOTAL | | 56 |
| RESERVED | | 72 |
| TOTAL | | 128 |

Longitudinal Tracks

The tape format for helical scan recorded magnetic tape 100 includes three longitudinal tracks 201–203 written on magnetic tape 100: servo control track 202, time code track 201 and one track 203, the use of which is to be determined. The servo control 202 and time code 201 tracks are located at the bottom of magnetic tape 100 while the unused track 203 is located at the top of magnetic tape 100. The servo control track 202 is recorded as helical tracks 204 are written onto magnetic tape 100 and contains pulse edges that mark the location of each helical track pair written on to magnetic tape 100. One use of servo control track 202 is to synchronize, during playback, the rotation of scanner 320 with the position of helical tracks 204 on magnetic tape 100. The time code track 201 is recorded as helical tracks 204 are written on to magnetic tape 100. The time code track 201 contains location information that uniquely identifies each scan group pair 700 on magnetic tape 100. Similar location information is contained in the helical tracks 204 themselves, but the longitudinal time code track 201 can be read at a higher tape speed, i.e., at 60× normal recording speed. This information can be used to position magnetic tape 100, while being transported at a 60× or 100× normal recording speed, to a specified scan group 700, based on scan group location information contained in the data record directory section 502 of internal leader header 105.

The various high speed search operations of the present invention are used to position a particular physical location on magnetic tape 100 under the read/write heads 321, 322 of scanner 320 in a significantly faster time and to a more accurate location than prior art methods. These prior art methods include positioning the tape to an approximate location of a desired data block, or, less efficiently, searching for the desired data block by performing a continuous read operation until the data block is located.

The servo system in a typical tape drive such as that used by the present method is capable of performing a high speed search to a scan group 700 which can be located via time code track 201 on magnetic tape 100. The servo can locate a particular area consisting of a group of twelve helical tracks 204 or two scan groups 700. By using longitudinal time code track 201, tape drive subsystem 300 can perform a high speed search at 60× or 100× normal recording speed to within two scan groups containing the data record that is requested. This is a much finer resolution than can be obtained by using a simple but less accurate distance measurement employed by prior art physical data identification techniques.

Write Data Path

Figure 8:
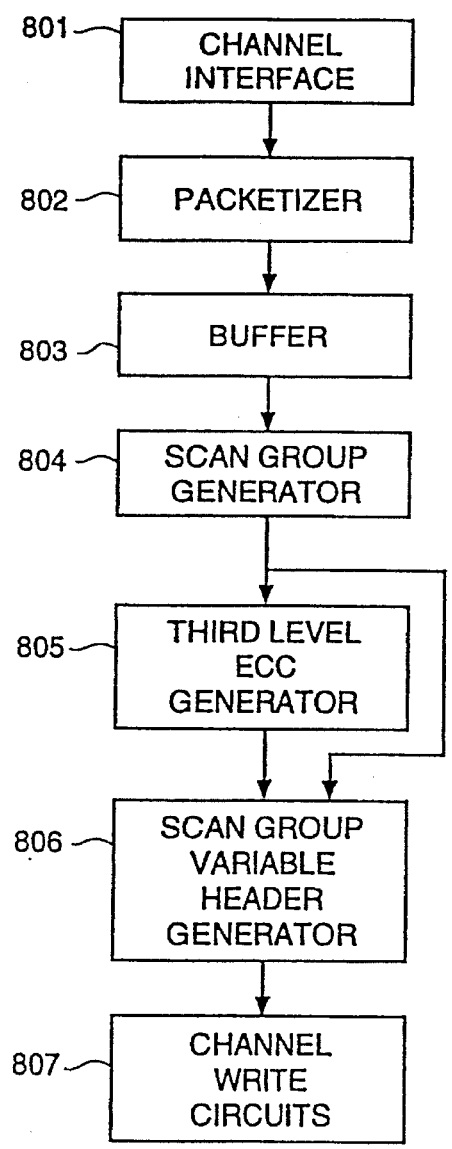
FIG. 8 illustrates in block diagram form the architecture of the write data path in the tape drive control unit.
Figure 14:
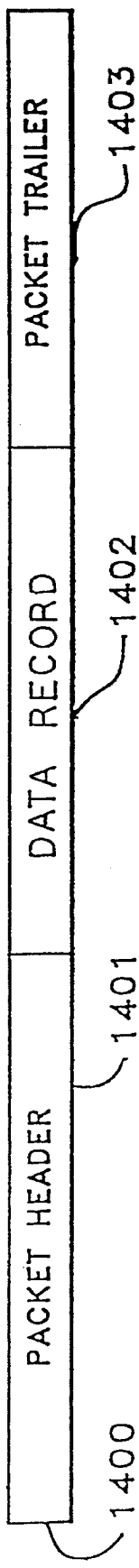
FIGS. 14–16 illustrates various aspects of the data formats.
Figure 15:
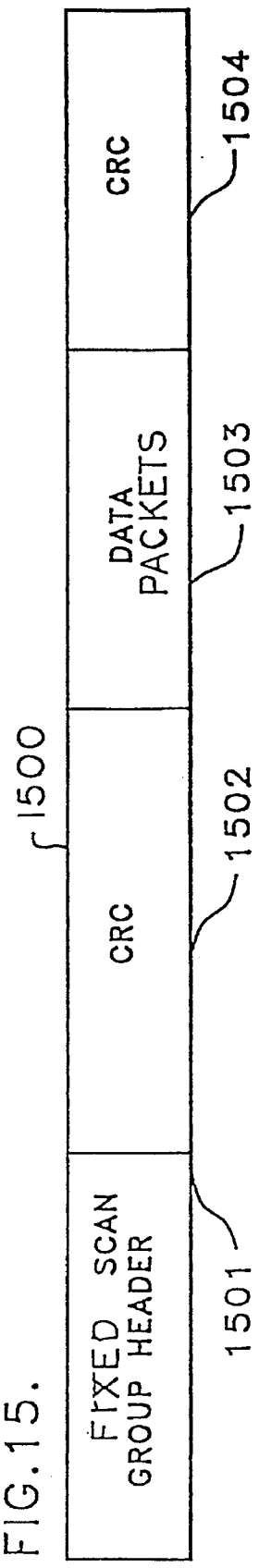
Figure 16:
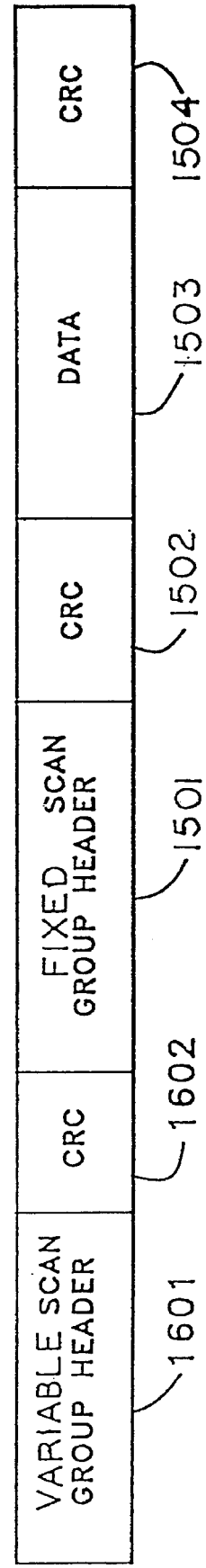

FIG. 8 illustrates in block diagram form the architecture of the write data path contained within tape drive control unit 350 while FIGS. 14–16 illustrate data formats used therein. The write data path includes a channel interface circuit 801 which interconnects tape drive control unit 350 with data channel 2 from host processor 1. Channel interface circuit 801 receives data blocks from host processor 1 and stores them in buffer 802 for processing by the hardware and software contained in tape drive control unit 350. Buffer 802 stores a predetermined amount of data that is received from host processor 1. A typical buffer size is 16 Mb or greater in order that host processor 1 can write a significant amount of data into tape drive control unit 350 without requiring interruption of the data transfer caused by the movement or delay in movement of the magnetic tape 100 on tape drive 300.

Packetizer circuit 802 receives data from channel interface 801 and packetizes the data 1401 as shown in FIG. 14 by adding a packet header 1402 which is protected by a cyclic redundancy check (CRC) (not shown). Data records received from host processor 1, whose block size do not exceed 262K bytes, are followed by a packet trailer 1403 and a CRC (not shown) which protects both data 1401 and packet trailer 1403. The packets 1400 produced by packetizer 803 are transmitted to buffer 803 for use by scan group generator 804 which reformats the packetized data 1400 by concatenating them into scan groups 1500 as shown in FIG. 15. If a scan group data field is incomplete, pad bytes are added to the scan group data field 1503 as required to complete the scan group data field 1503. A fixed scan group header 1501 and a two byte CRC character 1502 are then prepended to the scan group data field 1503 and a CRC code 1504 also appended thereto. The partial scan group 1500 thus generated is transmitted to third level ECC generator 805 which Exclusive ORs (for example) twenty-four scan groups 1500 to produce a third level ECC scan group. In addition, the scan groups 1500 are concurrently transmitted to variable scan group header generator 806 which produces, as shown in FIG. 16, a variable scan group header 1601 and CRC code 1602 which protects this rewriteable scan group header 1601, both of which are prepended to the scan group 1500. The resultant data 1600 is then transmitted to the channel write circuits 807 for writing the data in helical scan format on to magnetic tape 100.

Tape Read Operations

The search segment is used to make search entries in the header. The size of the search segment is a predetermined number of scan groups, typically 32 scan groups. The count indicative of the position of the first data group of a super group within a particular search segment is entered into the directory.

In reading a data record from the magnetic tape, the first data group of this data record may occur earlier or later on the magnetic tape than the location identified in the directory. The actual location of the start of the data record can legitimately be later due to write skips as disclosed herein, since a later version of this scan group may be the one that is to be read. However, the scan group should not occur earlier on the magnetic tape or later than a reasonable number of scan groups unless the directory entry is invalid. When an entry in the directory is found to be invalid, then the integrity of the entire directory is in question and the directory is considered invalid in its entirety.

Data Record Write to Magnetic Tape

Figure 11:
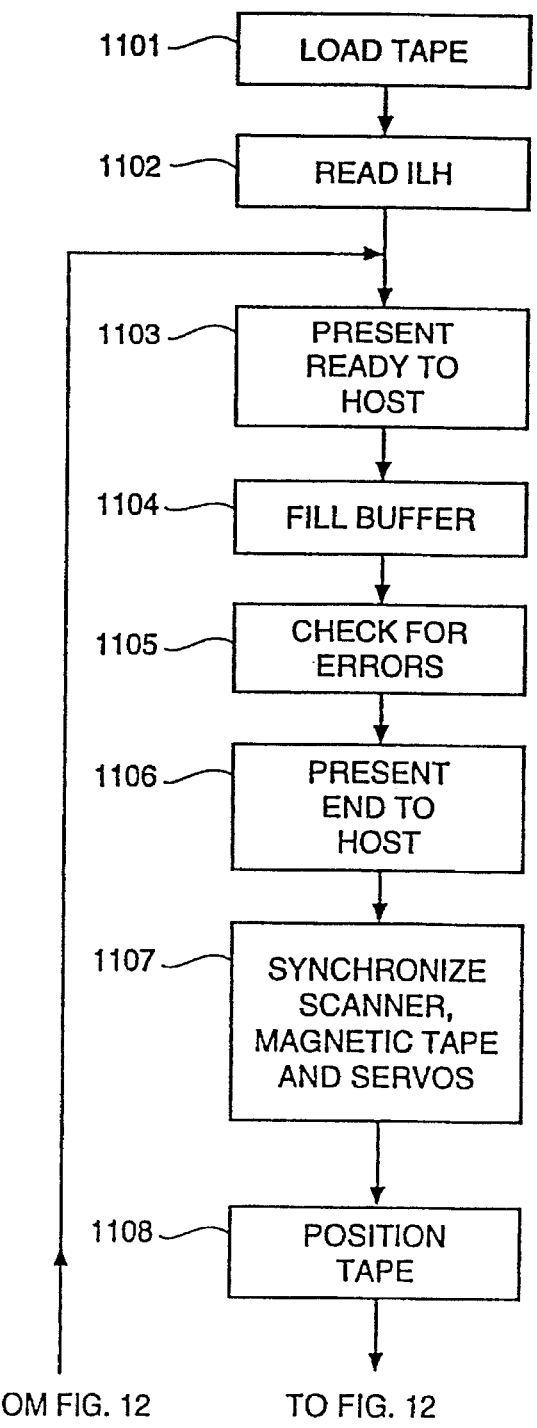
FIGS. 11–13 illustrate in flow diagram form the operational steps taken by the control unit to perform a number of operations on the magnetic tape.
Figure 12:
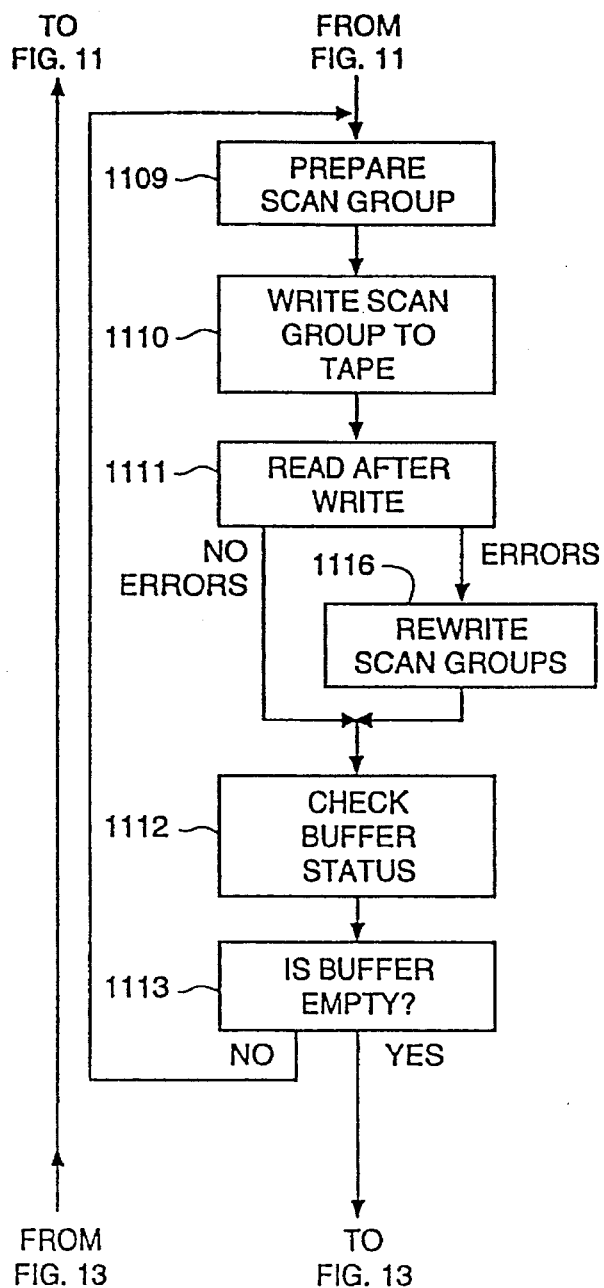
Figure 13:
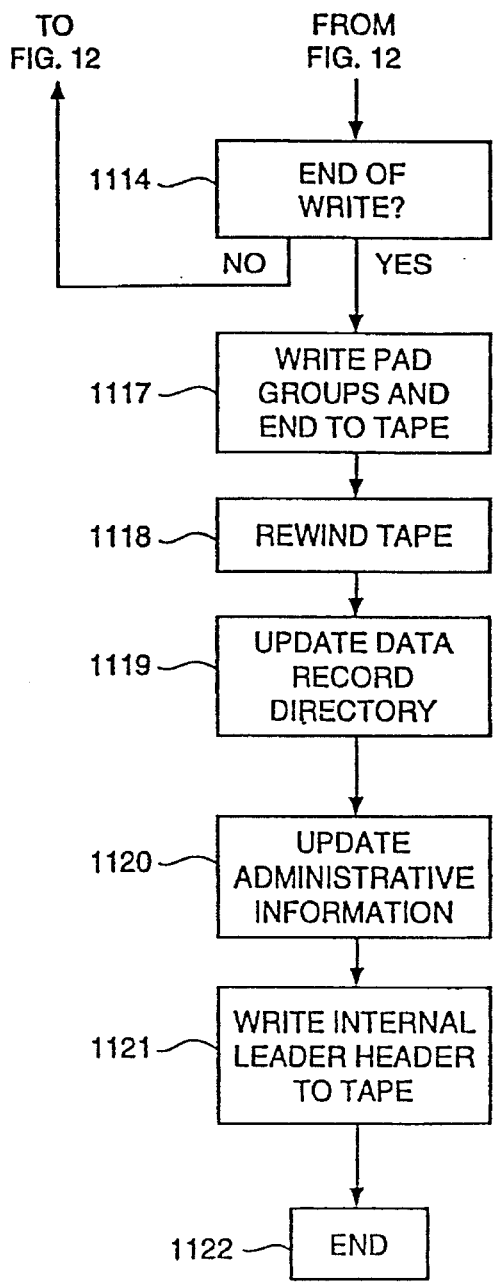

FIGS. 11–13 illustrate in flow diagram form the operational steps taken by tape drive 300 to write data in helical scan form on magnetic tape 100. At step 1101, a magnetic tape cartridge 301 is inserted into tape drive 300 and the tape drive mechanism illustrated in FIG. 3 loads the magnetic tape 100 by threading the leader block 101 and magnetic tape 100 through the tape threading path to the takeup reel 360 which rotates around spindle 361. At step 1102, magnetic tape 100 is advanced forward in order to enable the tape drive control unit 350 to read the internal leader header 105 written on to this magnetic tape 100 via read heads 322 of scanner 320. If this tape is a blank tape, there is no internal leader header 105 on this magnetic tape 100 and the header segment is created thereon. If the tape has been previously used, the internal leader header 105 contains the information described above and enables tape drive control unit 350 to determine where on magnetic tape 100 the data records have been written. At step 1103, tape drive control unit 350 presents a ready signal to host processor 1 indicating that tape drive subsystem 300 is ready to receive data and commands from host computer 1 via data channel 2. At step 1104, host processor 1 transmits data over data channel 2 that interconnects it to tape drive 300 and the data is written into buffer 803. As the data are written into buffer 803, tape drive control unit 350 checks for errors to make sure there are no transmission errors in the data received from host processor 1. Since tape drive subsystem 300 can typically write data to magnetic tape 100 faster than host processor 1 can write the data into buffer 803, tape drive control unit 350 waits at step 1105 for host processor 1 to complete its data transmission and checks for errors. At step 1106 tape drive subsystem 300 presents the proper ending status to host processor 1 indicating that the data records have been written into buffer 803. When buffer 803 is filled to a predetermined level, tape drive subsystem 300 begins writing the data to magnetic tape 100 in order to free up more buffer space for host processor 1 to continue writing data records therein. At step 1107 tape drive control unit 350 ensures that scanner 320, magnetic tape 100 and servos (not shown) are all synchronized. At step 1108, the control unit 350 positions magnetic tape 100 to the physical location on magnetic tape 100 where writing is to begin. At step 1109, control unit 350 prepares the appropriate scan group 700 to be written. For the purpose of this description, assume that the scan groups written to magnetic tape 100 represent data records received from host processor 1 and stored in buffer 803. As described above, third level ECC scan groups are periodically written into the stream of data records to form super groups which are written on magnetic tape 100. At step 1110, control unit 350 activates the read/write mechanism described above to write the scan group to magnetic tape 100 and at step 1111, the read after write process reads scan groups 700 as they are written on to magnetic tape 100 in order to ensure their integrity. If an error is detected in the written scan group, the scan group is rewritten further along magnetic tape 100 at step 1116. At step 1112, control unit 350 checks the buffer status and at step 1113 determines whether further data is in buffer 803. If data are in buffer 803, steps 1109–1113 are repeated until, at step 1113, no more data is available from buffer 803. Control unit 350 determines at step 1114 whether more data are expected from host processor 1.

At this point (step 1117), control unit 350 writes a plurality (typically four) pad groups and end groups after the last written scan group in order to complete the writing of this stream of data records. At step 1118, magnetic tape 100 is rewound to its beginning and, at step 1119, data record directory 502 is updated with information concerning the physical location and identity of the data records that have just been written on to magnetic tape 100. At step 1120, control unit 350 updates the administrative information section 501 of internal leader header 105. This information is described above and entails elements 2601–2604 and 2101–2108 being sequentially activated and their outputs multiplexed by Multiplexer 2201 into buffer 802 to form a scan group for internal leader header 105. The elements disclosed in FIG. 4 can be registers in control unit 350, software routines that execute in control unit 350, memory entries in the memory (not shown) that is part of control unit 350, etc. Suffice it to say that the nature of the data created by each of elements 2601–2604, 2101–2108 determines the implementation of the corresponding element. Multiplexer 2201 represents the element in control unit 350 that formats all the data created by elements 2601–2608, 2101–2108 into the formats illustrated in FIGS. 6 and 10. Again, it is expected that Multiplexer 2201 may be a software element within control unit 350 that formats the data created by elements 2601–2608, 2101–2108 into data record-directory 502 and administrative information 501 sections of internal leader header. Thus, on an initial load of magnetic tape 100, the internal leader header 105 is read and the data contained therein are read into elements 2601–2608, 2101–2108 as illustrated by the inputs on the left side of FIG. 4 to each of the elements 2601–2608, 2101–2108. During the use of magnetic tape 100, many of these data entries are updated, supplemented and/or modified until control unit 350 rewrites internal leader header 105, at which time the data contained in and generated by elements 2601–2608, 2101–2108 is used to populate internal leader header 105, which is then written on magnetic tape 100 at step 1121. At step 1122, the tape write operation is completed and magnetic tape 100 can be unloaded or positioned ready for subsequent data record writes. If, at step 1114, control unit 350 determines that further data are expected from host processor 1, control unit 350 at step 1115 writes a plurality of pad scan groups following the end of the last written data scan group and rewinds magnetic tape 100 to the end of the first of these pad scan groups. Control unit 350 then returns to step 1103 and presents a ready status to host processor 1.

We claim:

1. In a helical scan tape drive which reads and writes a stream of data records, received from a host processor, in stripes on a magnetic tape, apparatus operationally independent of said host processor for providing administrative data relating to data records written on said magnetic tape, comprising:

means for creating a header segment having a defined extent on said magnetic tape wherein said header segment is located at a beginning of said magnetic tape before said data records and wherein said header segment contains administrative data relating to said data records written on said magnetic tape;

means for writing data records received from said host processor on said magnetic tape exclusive of said header segment;

means, responsive to receipt of a data record from said host processor, for generating said administrative data, comprising:

means for inserting data record location information into said administrative data and associated with a selected data record to identify a physical location of said selected data record on said magnetic tape, means for inserting media information into said administrative data to identify media characteristics; and means for writing said administraive data in said header segment of said magnetic tape, independent of said host processor.

2. The apparatus of claim 1 wherein said data record location inserting means comprises:

means for segmenting said magnetic tape into a plurality of search segments, each representative of a predetermined number of scan groups written on said magnetic tape.

3. The apparatus of claim 2 wherein said data record location inserting means further comprises:

means for identifying one of said search segments in which a received data record is written on said magnetic tape; and means for inserting data, indicative of said identified search segment, into said administrative data.

4. The apparatus of claim 3 wherein said data record location inserting means further comprises:

means for writing data, indicative of a number of scan groups following a boundary of said identified search segment to which said data record begins, into said administrative data.

5. The apparatus of claim 3 wherein said data record location inserting means further comprises:

means for writing a data record write protect status into a reserve field of said administrative data and associated with a selected data record substantially concurrently with said selected data record being accessed by said host processor, to indicate that said selected data record has been write protected.

6. The apparatus of claim 5 further comprising:

means responsive to the presence of said data record write protect status associated with said selected data record for disabling said tape drive from modifying the data contained in said data record.

7. The apparatus of claim 1 wherein said media information inserting means comprises:

means for writing a media write protect status into said administrative data to indicate that said magnetic tape has been write protected.

8. The apparatus of claim 7 further comprising:

means responsive to the presence of said media write protect status for disabling said tape drive from modifying said data records written in said magnetic tape.

9. The apparatus of claim 1 wherein said media information inserting means comprises:

means for copying data indicative of the identity of said tape drive into said administrative data.

10. The apparatus of claim 9 wherein said copying means comprises:

means for writing tape volume identification into said administrative data.

11. The apparatus of claim 1 wherein said media identification inserting means comprises:

means for writing media element identification data into said administrative data to identify the initial use date of said magnetic tape.

12. The apparatus of claim 1 wherein said data record location inserting means comprises:

means for writing last data record location data into said administrative data to indicate the physical location on said magnetic tape of an end of a last written data record contained on said magnetic tape.

13. The apparatus of claim 1 wherein said media information inserting means comprises:

means for writing data indicative of amount of use of said magnetic tape into said administrative data.

14. The apparatus of claim 1 wherein said media information inserting means comprises:

means, responsive to said tape drive detecting a media failure, for writing media failure data into said administrative data to record a history of media failures.

15. In a tape drive which reads and writes a stream of data records, received from a host processor, in stripes on a magnetic tape operationally independent of said host processor, for providing administrative data relating to data records written on said magnetic tape, a method comprising the steps of:

creating a header segment having a defined extent on said magnetic tape wherein said header segment is located at a beginning of said magnetic tape before said data records and wherein said header segment contains administrative data relating to said data records written on said magnetic tape;

writing data records received from a host processor on said magnetic tape exclusive of said header segment;

generating in response to receipt of a data record from said host processor, administrative data comprising:

inserting data record location information into said administrative data and associated with a selected data record to identify a physical location of said selected data record on said magnetic tape, inserting media information into said administrative data to identify media characteristics; and writing said administrative data in said header segment of said magnetic tape, independent of said host processor.

16. The method of claim 15 wherein said step of data record location inserting comprises:

segmenting said magnetic tape into a plurality of search segments, each representative of a predetermined number of scan groups written on said magnetic tape.

17. The method of claim 16 wherein said step of data record location inserting further comprises:

identifying one of said search segments in which a received data record is written on said magnetic tape; and inserting data, indicative of said identified search segment, into said administrative data.

18. The method of claim 17 wherein said step of data record location inserting further comprises:

writing data, indicative of a number of scan groups following a boundary of said identified search segment to which said data record begins, into said administrative data.

19. The method of claim 18 wherein said step of data record location inserting further comprises:

writing a data record write protect status into a reserve field of said administrative data and associated with a selected data record substantially concurrently with said selected data record being accessed by said host processor, to indicate that said selected data record has been write protected.

20. The method of claim 19 further comprising the step of:

disabling, in response to the presence of said data record write protect status associated with said selected data record, said tape drive from modifying the data contained in said data record.

21. The method of claim 15 wherein said step of media information inserting further comprises:

writing a media write protect status into said administrative data to indicate that said magnetic tape has been write protected.

22. The method of claim 21 further comprising the step of:

disabling, in response to the presence of said media write protect status, said tape drive from modifying said data records written on said magnetic tape.

23. The method of claim 15 wherein said step of media information inserting comprises:

copying data indicative of the identity of said tape drive into said administrative data.

24. The method of claim 23 wherein said step of copying includes:

writing tape volume identification into said administrative data.

25. The method of claim 15 wherein said step of media identification inserting comprises:

writing media element identification data into said administrative data to identify the initial use date of said magnetic tape.

26. The method of claim 15 wherein said step of data record location inserting comprise:

writing last data record location data into said administrative data to indicate the physical location on said magnetic tape of an end of a last written data record contained on said magnetic tape.

27. The method of claim 15 wherein said step of media information inserting comprises:

writing data indicative of amount of use of said magnetic tape into said administrative data.

28. The method of claim 15 wherein said step of media information inserting comprises:

writing, in response to said tape drive detecting a media failure, media failure data into said administrative data to record a history of media failures.

* * * * *